(12) United States Patent
Takemoto

(10) Patent No.: US 9,560,303 B2
(45) Date of Patent: Jan. 31, 2017

(54) SOLID-STATE IMAGING DEVICE, IMAGING DEVICE, AND SIGNAL READING METHOD

(71) Applicant: OLYMPUS CORPORATION, Tokyo (JP)

(72) Inventor: Yoshiaki Takemoto, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 21 days.

(21) Appl. No.: 14/694,519

(22) Filed: Apr. 23, 2015

(65) Prior Publication Data
US 2015/0229861 A1 Aug. 13, 2015

Related U.S. Application Data

(63) Continuation of application No. PCT/JP2012/077741, filed on Oct. 26, 2012.

(51) Int. Cl.
H04N 5/378 (2011.01)
H04N 5/374 (2011.01)
(Continued)

(52) U.S. Cl.
CPC .............. H04N 5/378 (2013.01); H01L 24/17 (2013.01); H01L 27/14612 (2013.01);
(Continued)

(58) Field of Classification Search
CPC .. H04N 5/369; H01L 27/146; H01L 27/14641
See application file for complete search history.

(56) References Cited

U.S. PATENT DOCUMENTS 6,111,628 A 8/2000 Shiota et al.
8,773,583 B2 * 7/2014 Wakiyama ............ H01L 21/563
348/374
(Continued)

FOREIGN PATENT DOCUMENTS

JP 06-112463 4/1994
JP 10-246894 9/1998
(Continued)

OTHER PUBLICATIONS

International Search Report dated Dec. 25, 2012 for Appln. No. PCT/JP2012/077741.
(Continued)

Primary Examiner — James Hannett
(74) Attorney, Agent, or Firm — Pillsbury Winthrop Shaw Pittman, LLP

(57) ABSTRACT

A solid-state imaging device includes: first electrode pads formed on a first substrate on which photoelectric conversion elements included in pixels are arranged; second electrode pads formed on a second substrate having a reading unit that reads signals of the pixels; and connecting portions, one end being bonded to the first electrode pads and the other being bonded to the second electrode pads to electrically connect the first electrode pads and the second electrode pads to each other. The pixels are partitioned into areas for each unit pixel cell or each cell including pixels, first to n-th of the first electrode pads and first to m-th of the second electrode pads are allocated to the partitioned areas, and the first to n-th first electrode pads and the first to m-th second electrode pads allocated to the same partitioned area are electrically connected to each other via the connecting portions.

24 Claims, 11 Drawing Sheets

(51) Int. Cl.
*H01L 27/146* (2006.01)
*H04N 5/3745* (2011.01)
*H01L 23/00* (2006.01)

(52) U.S. Cl.
CPC .. *H01L 27/14634* (2013.01); *H01L 27/14636* (2013.01); *H01L 27/14641* (2013.01); *H04N 5/374* (2013.01); *H04N 5/37457* (2013.01); H01L 2924/12043 (2013.01)

(56) References Cited

U.S. PATENT DOCUMENTS

| | | | |
|---|---|---|---|
| 9,025,064 B2* | 5/2015 | Aoki | H04N 5/3745 348/302 |
| 2002/0016022 A1 | 2/2002 | Shintani | |
| 2006/0023109 A1* | 2/2006 | Mabuchi | H01L 24/17 348/340 |
| 2012/0026371 A1* | 2/2012 | Itano | H04N 3/1568 348/301 |
| 2012/0057056 A1* | 3/2012 | Oike | H01L 27/14634 348/294 |
| 2014/0104471 A1* | 4/2014 | Mabuchi | H01L 24/17 348/301 |
| 2016/0044266 A1* | 2/2016 | Oike | H01L 27/14634 348/308 |

FOREIGN PATENT DOCUMENTS

| | | |
|---|---|---|
| JP | 2001-215151 | 8/2001 |
| JP | 2002-016101 | 1/2002 |
| JP | 2002-344809 | 11/2002 |
| JP | 2006-049361 | 2/2006 |
| JP | 2007-214191 | 8/2007 |
| JP | 2007-220866 | 8/2007 |
| JP | 2010-147834 | 7/2010 |
| JP | 2010-219339 | 9/2010 |
| JP | 2012-156374 | 8/2012 |

OTHER PUBLICATIONS

Japanese Office Action dated Feb. 3, 2015 for Appln. No. 2011-111283.

* cited by examiner

SOLID-STATE IMAGING DEVICE, IMAGING DEVICE, AND SIGNAL READING METHOD

CROSS REFERENCE TO RELATED APPLICATIONS

This application is a continuation application based on a PCT Patent Application No. PCT/JP2012/077741, filed Oct. 26, 2012, the content of which is hereby incorporated by reference.

BACKGROUND OF THE INVENTION

Field of the Invention

The present invention relates to a solid-state imaging device, an imaging device, and a signal reading method.

Description of the Related Art

Recently, video cameras, electronic still cameras, and the like have been widely used. Charge coupled device (CCD) type or amplification type solid-state imaging devices are used in such cameras. An amplification type solid-state imaging device guides signal charges, which have been generated and stored in a photoelectric conversion portion of a pixel on which light is incident, to an amplification portion disposed in the pixel and outputs a signal, which has been amplified by the amplification portion, from the pixel. In the amplification type solid-state imaging device, such pixels are arranged in a two-dimensional matrix shape. An example of the amplification type solid-state imaging device is a complementary metal oxide semiconductor (CMOS) type solid-state imaging device using a CMOS transistor.

In the related art, a general CMOS type solid-state imaging device employs a method of sequentially reading signal charges, which have been generated by photoelectric conversion portions of pixels arranged in a two-dimensional matrix shape, for each row. In this method, since an exposing timing in the photoelectric conversion portion of each pixel is determined depending on reading start and end of the signal charges, the exposing timing differs for each row. Accordingly, when a rapidly moving subject is imaged using the CMOS type solid-state imaging device, the subject in the captured image is deformed.

In order to remove the deformation of a subject, a simultaneous imaging function (global shutter function) of realizing synchronous storage of signal charges has been proposed. Uses of the CMOS type solid-state imaging device having the global shutter function are becoming various. In order to store signal charges generated by the photoelectric conversion portions until the signal charges are read, the CMOS type solid-state imaging device having the global shutter function generally needs to have a storage capacitor portion having a light-blocking property. In such a CMOS type solid-state imaging device according to the related art, all of the pixels are simultaneously exposed, then signal charges generated by the photoelectric conversion portions are simultaneously transferred from all of the pixels to the storage capacitor portions and are temporarily stored therein, and the signal charges are sequentially converted into pixel signals at a predetermined reading timing and are read.

However, in the CMOS type solid-state imaging device according to the related art having the global shutter function, the photoelectric conversion portions and the storage capacitor portions have to be formed in the same plane of the same substrate and thus an increase in chip area is inevitable. In a waiting period of time until the signal charges stored in the storage capacitor portions are read, signal quality is degraded by noise due to light or noise due to a leak current (dark current) generated in the storage capacitor portions.

A solid-state imaging device in which a MOS image sensor chip in which micro pads are formed on a wiring layer side for each unit cell and a signal processing chip in which micro pads are formed on a wiring layer side at positions corresponding to the micro pads of the MOS image sensor chip are connected to each other by micro bumps is disclosed in Japanese Unexamined Patent Application, First Publication No. 2006-49361. A method of preventing an increase in chip area using a solid-state imaging device in which a first substrate on which photoelectric conversion portions are formed and a second substrate on which a plurality of MOS transistors are formed are bonded to each other is disclosed in Japanese Unexamined Patent Application, First Publication No. 2010-219339.

SUMMARY

According to a first aspect of the present invention, there is provided a solid-state imaging device including: first electrode pads that are formed on a first substrate on which a plurality of photoelectric conversion elements included in pixels are arranged; second electrode pads that are formed on a second substrate having a reading unit that reads signals of the pixels; and connecting portions, one end of each of which is bonded to the first electrode pads and the other end of each of which is bonded to the second electrode pads to electrically connect the first electrode pads and the second electrode pads to each other, wherein the plurality of pixels are partitioned into a plurality of areas for each unit pixel cell or each cell including a plurality of pixels, first to n-th of the first electrode pads and first to m-th of the second electrode pads (where n and m are integers equal or greater than 1) are allocated to the partitioned areas, and the first to n-th first electrode pads and the first to m-th second electrode pads allocated to the same partitioned area are electrically connected to each other via the plurality of connecting portions.

According to a second aspect of the present invention, there is provided an imaging device including: first electrode pads that are formed on a first substrate on which a plurality of photoelectric conversion elements included in pixels are arranged; second electrode pads that are formed on a second substrate having a reading unit that reads signals of the pixels; and connecting portions, one end of each of which is bonded to the first electrode pads and the other end of each of which is bonded to the second electrode pads to electrically connect the first electrode pad and the second electrode pad to each, wherein the plurality of pixels are partitioned into a plurality of areas for each unit pixel cell or each cell including a plurality of pixels, first to n-th of the first electrode pads and first to m-th of the second electrode pads (where n and m are integers equal or greater than 1) are allocated to the partitioned areas, and the first to n-th first electrode pads and the first to m-th second electrode pads allocated to the same partitioned area are electrically connected to each other via the plurality of connecting portions.

According to a third aspect of the present invention, there is provided a signal reading method of reading a signal from pixels in a solid-state imaging device having: first electrode pads that are formed on a first substrate on which a plurality of photoelectric conversion elements included in pixels are arranged; second electrode pads that are formed on a second substrate having a reading unit that reads signals of the pixels; and connecting portions, one end of each of which is bonded to the first electrode pads and the other end of each of which is bonded to the second electrode pads to electrically connect the first electrode pads and the second electrode pads to each other, wherein the plurality of pixels are partitioned into a plurality of areas for each unit pixel cell or each cell including a plurality of pixels, first to n-th of the first electrode pads and first to m-th of the second electrode pads (where n and m are integers equal or greater than 1) are allocated to the partitioned areas, and the first to n-th first electrode pads and the first to m-th second electrode pads allocated to the same partitioned area are electrically connected to each other via the plurality of connecting portions, the signal reading method including: a reading step of causing the reading unit to read a signal generated from the photoelectric conversion elements arranged on the first substrate via the first electrode pads, the connecting portions, and the second electrode pads.

DETAILED DESCRIPTION OF THE PREFERRED EMBODIMENTS

First Embodiment

Hereinafter, a first embodiment of the present invention will be described with the accompanying drawings. The following detailed description is merely an example and includes specific details. Even when various variations or changes are made in the following details, it will be understood by those skilled in the art that the details including the variations or changes do not depart from the scope of the present invention. Therefore, various embodiments to be described below do not damage the generality of the invention described in the appended claims and do not limit the invention described in the claims at all.

Figure 1:
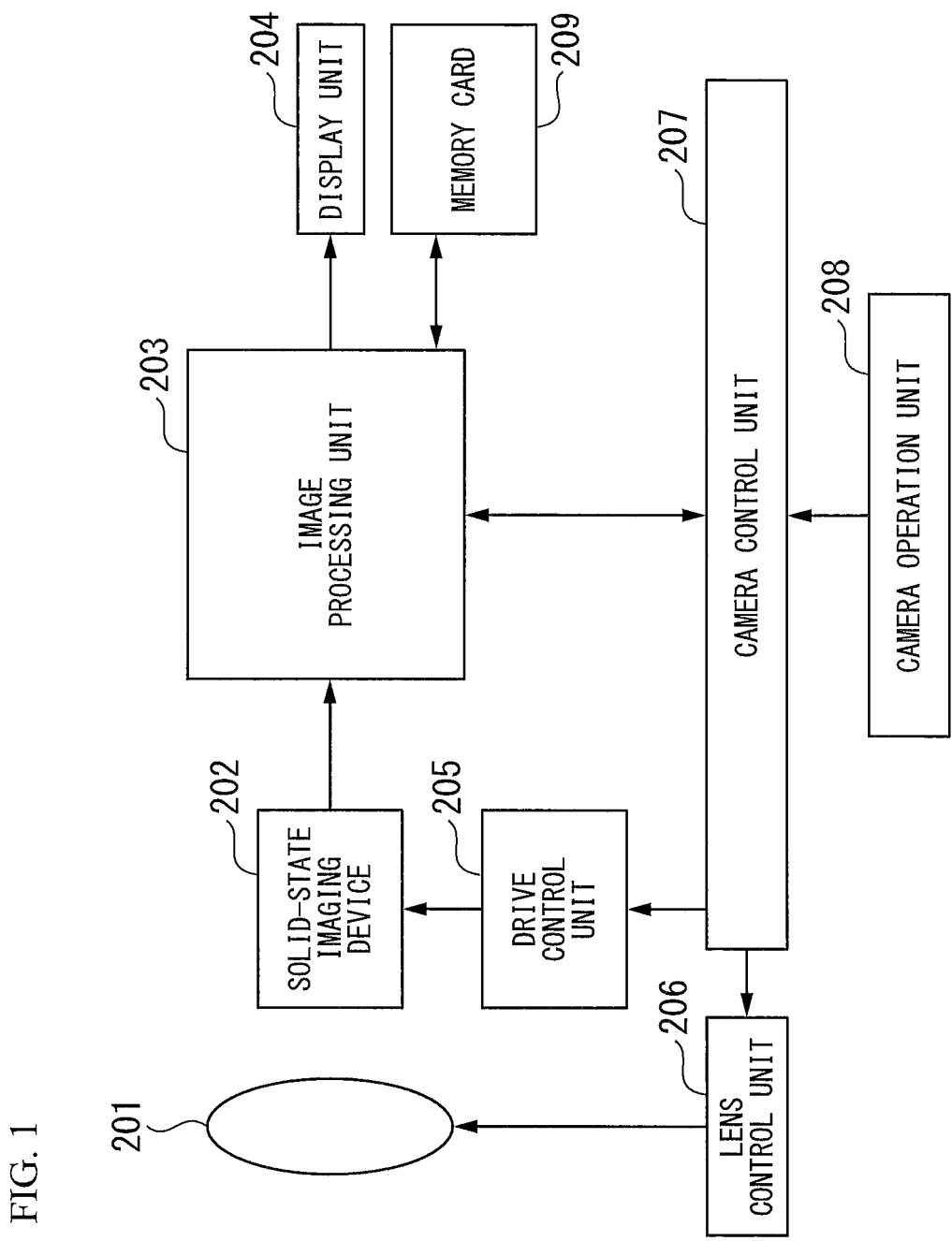
FIG. 1 is a block diagram illustrating a configuration of an imaging device according to a first embodiment of the present invention.

FIG. 1 illustrates a configuration of an imaging device according to this embodiment. The imaging device according to an embodiment of present invention need only be an electronic device having an imaging function and examples thereof include a digital video camera and an endoscope in addition to a digital camera.

The imaging device illustrated in FIG. 1 includes a lens 201, a solid-state imaging device 202, an image processing unit 203, a display unit 204, a drive control unit 205, a lens control unit 206, a camera control unit 207, and a camera operation unit 208. A memory card 209 is also illustrated in FIG. 1, but the memory card 209 may not be an element unique to the imaging device, and the memory card 209 may be configured to be attached to and detached from the imaging device.

The blocks illustrated in FIG. 1 may be realized by various components such as electrical circuit components such as a CPU and a memory of a computer, optical components such as a lens, and operation components such as a button and a switch in hardware, or may be realized by a computer program or the like in software, but are illustrated as functional blocks which are realized through coordination of hardware and software herein. Accordingly, it will be understood by those skilled in the art that the functional blocks can be embodied in various forms through combinations of hardware and software.

The lens 201 is a lens for focusing an optical image of a subject on an imaging plane of the solid-state imaging device 202 (solid-state imaging element). The solid-state imaging device 202 includes a plurality of pixel cells and is configured to convert an optical image of a subject focused by the lens 201 into a digital image signal by photoelectric conversion and to output the digital image signal. The image processing unit 203 performs a variety of digital image processing on the image signal output from the solid-state imaging device 202.

The display unit 204 displays an image based on the image signal processed by the image processing unit 203 for display. The display unit 204 can reproduce and display a still image and perform a moving image (live view) display of displaying an image of an imaging range in real time. The drive control unit 205 controls the operation of the solid-state imaging device 202 based on an instruction from the camera control unit 207. The drive control unit 205 may be installed in the solid-state imaging device 202. The lens control unit 206 controls an iris diaphragm or a focal point of the lens 201 based on an instruction from the camera control unit 207.

The camera control unit 207 controls the entire imaging device. The operation of the camera control unit 207 is defined by a program stored in a ROM built in the imaging device. The camera control unit 207 reads the program and performs various controls based on the details defined by the program. The camera operation unit 208 includes various operation members for allowing a user to input various operations to the imaging device and outputs a signal based on the operation input result to the camera control unit 207. Specific examples of the camera operation unit 208 include a power supply switch for turning the imaging device on and off, a release button for instructing capturing of a still image, and a still image capturing mode switch for switching a still image capturing mode between a single shooting mode and a consecutive shooting mode. The memory card 209 is a recording medium for storing an image signal processed by the image processing unit 203 for recording.

Figure 2:
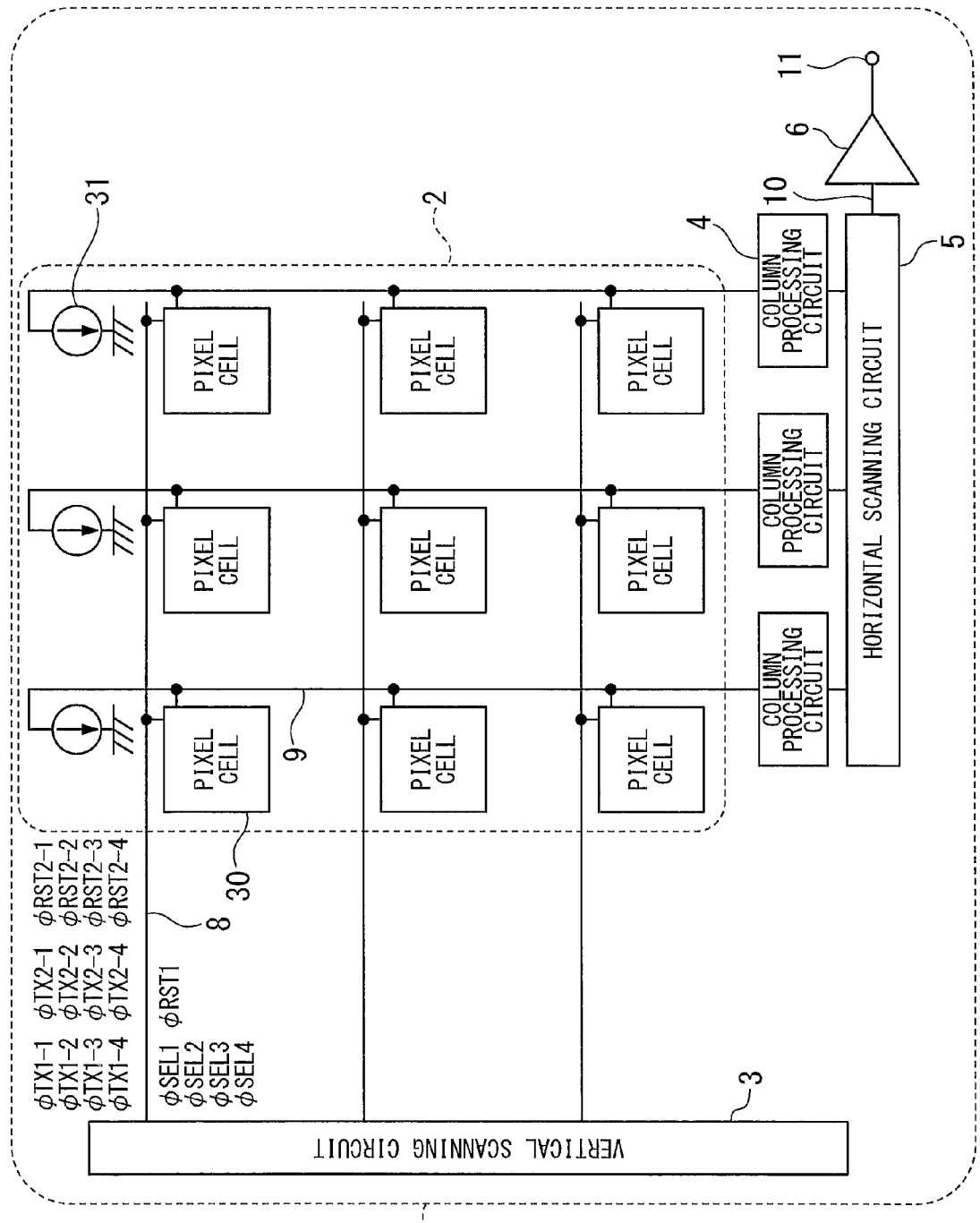
FIG. 2 is a block diagram illustrating a configuration of a solid-state imaging device which is included in the imaging device according to the first embodiment of the present invention.

FIG. 2 illustrates a configuration of the solid-state imaging device 202. The solid-state imaging device 202 includes a pixel array unit 2 having a plurality of pixel cells 30 and vertical signal line current sources 31, a vertical scanning circuit 3, a column processing circuit 4, a horizontal scanning circuit 5, and an output amplifier 6. Each pixel cell 30 includes a plurality of pixels. Each pixel includes a photoelectric conversion portion and a memory. In this embodiment, the number of photoelectric conversion portions corresponds to the number of pixels in the solid-state imaging device 202. A pixel signal output from a pixel is a signal of a unit section from which a digital signal is extracted when the solid-state imaging device 202 captures an image. The arrangement positions of the circuit elements illustrated in FIG. 2 do not necessarily correspond to the actual arrangement positions.

In the pixel array unit 2, the plurality of pixel cells 30 are arranged in a two-dimensional matrix shape. In FIG. 2, nine pixel cells 30 are arranged in 3 rows×3 columns, but the arrangement of the pixel cells 30 illustrated in FIG. 2 is merely an example and the number of rows and the number of columns need only be equal to or greater than one. FIG. 2 is a diagram schematically illustrating an example in which the pixel cells 30 are arranged in a matrix shape, and the pixel cells 30 need not be separated and arranged as illustrated in FIG. 2.

In this embodiment, an area including all of the pixels of the solid-state imaging device 202 is set as a reading target area of pixel signals, but a part of the area including all of the pixels of the solid-state imaging device 202 may be set as the reading target area. It is preferable that the reading target area include all of the pixels of an effective pixel area. The reading target area may include optical black pixels (pixels which are normally shielded from light) which are arranged outside the effective pixel area. For example, the pixel signal read from the optical black pixels is used to correct a dark current component.

The vertical scanning circuit 3 is formed of for example, a shift register, controls driving of each pixel cell 30 including a plurality of pixels, and outputs a pixel signal, which is a signal output from the pixels, to a vertical signal line 9. This driving control includes a pixel reset operation, a storage operation, a signal reading operation, and the like.

In order to perform this driving control, the vertical scanning circuit 3 outputs a control signal (control pulse) to the pixel cells 30 via a control signal line 8 disposed for each pixel cell 30, and independently controls the pixel cells 30 for each row. In the illustrated example, the control signal line 8 from the vertical scanning circuit 3 to one pixel cell 30 is illustrated as a single line, but actually includes two or more lines.

The column processing circuit 4 is connected to the vertical signal line 9 for each column and performs signal processing such as noise removal or amplification on the pixel signal output from the pixel cells 30. The horizontal scanning circuit 5 is formed of, for example, a shift register, and reads pixel signals by selecting the columns of the pixel cells 30 from which the pixel signal is read, sequentially selecting the column processing circuits 4 corresponding to the columns of the selected pixel cells 30, and sequentially outputting the pixels signals from the column processing circuits 4 to the output amplifier 6. The output amplifier 6 performs signal processing on the pixel signals input from the horizontal scanning circuit 5 and outputs the pixels signals to the outside via an output terminal 11.

Figures 3A, 3B:
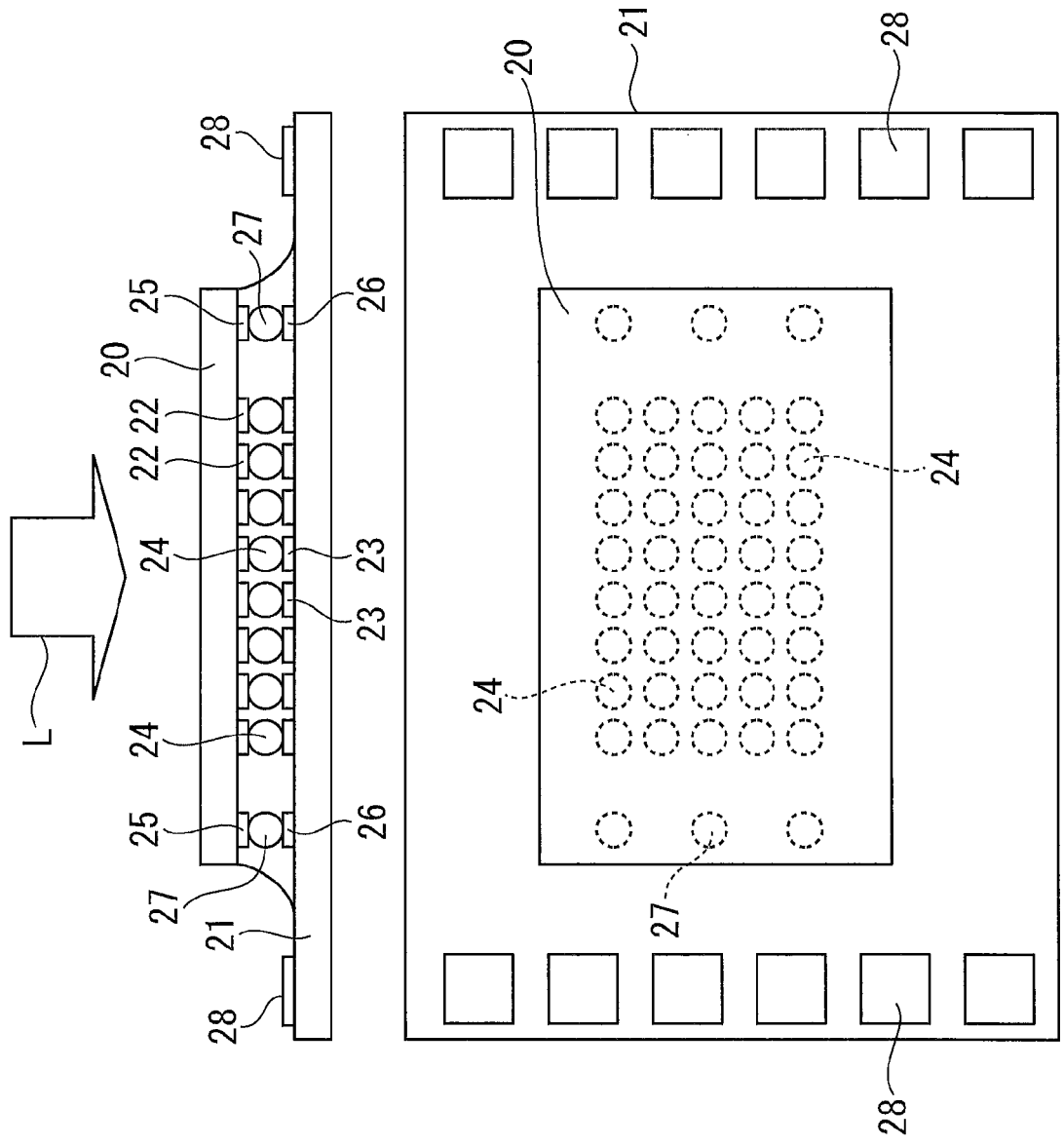
FIG. 3A is a cross-sectional view and a plan view of the solid-state imaging device according to the first embodiment of the present invention.
FIG. 3B is a cross-sectional view and a plan view of the solid-state imaging device according to the first embodiment of the present invention.

FIGS. 3A and 3B illustrate a cross-sectional structure (FIG. 3A) and a planar structure (FIG. 3B) of the solid-state imaging device 202. The solid-state imaging device 202 has a structure in which two substrates (a first substrate 20 and a second substrate 21) on which circuit elements (such as photoelectric conversion elements, transistors, and capacitors) constituting the pixel cells 30 are arranged overlap. The circuit elements constituting the pixel cells 30 are distributed and arranged in the first substrate 20 and the second substrate 21. The first substrate 20 and the second substrate 21 are electrically connected to each other such that electrical signals are transmitted and received between the two substrates when the pixel cells 30 are driven.

Photoelectric conversion elements are formed on one main surface which is irradiated with light L among two main surfaces (surfaces having a relatively larger area than a side surface) of the first substrate 20, and the light with which the first substrate 20 is irradiated is incident on the photoelectric conversion elements. A plurality of micro pads 22 (first electrode pads) which are electrodes for connection to the second substrate 21 are formed on the opposite main surface of the main surface which is irradiated with light L among the two main surfaces of the first substrate 20. In this embodiment, two micro pads 22 are disposed for each pixel cell 30. On one main surface facing the first substrate 20 among two main surfaces of the second substrate 21, a plurality of micro pads 23 (second electrode pads) which are electrodes for connection to the first substrate 20 are formed at positions corresponding to the micro pads 22.

Micro bumps 24 (connecting portions) are formed between the micro pads 22 and the micro pads 23. The first substrate 20 and the second substrate 21 are arranged to overlap such that the micro pads 22 and the micro pads 23 face each other, and are incorporated into one body such that the micro pads 22 and the micro pads 23 are electrically connected to each other by the micro bumps 24. A signal based on signal charges generated in the photoelectric conversion elements arranged on the first substrate 20 is output to the second substrate 21 via the micro pads 22, the micro bumps 24, and the micro pads 23.

Micro pads 25 having the same structure as the micro pads 22 are formed in a peripheral part of the opposite main surface of the main surface which is irradiated with light L among the two main surfaces of the first substrate 20. On the main surface facing the first substrate 20 among the two main surfaces of the second substrate 21, micro pads 26 having the same structure as the micro pads 23 are formed at positions corresponding to the micro pads 25. Micro bumps 27 are formed between the micro pads 25 and the micro pads 26. A source voltage or the like for driving the circuit elements arranged on the first substrate 20 or the circuit elements arranged on the second substrate 21 is supplied from the first substrate 20 to the second substrate 21 or from the second substrate 21 to the first substrate 20 via the micro pads 25, the micro bumps 27, and the micro pads 26.

A pad 28 used as an interface with a system other than the first substrate 20 and the second substrate 21 is formed in a peripheral part of one main surface among the two main surfaces of the second substrate 21. Instead of the pad 28, a penetration electrode penetrating the second substrate 21 may be formed and the penetration electrode may be used as an external connection electrode. In the example illustrated in FIGS. 3A and 3B, the areas of the main surfaces of the first substrate 20 and the second substrate 21 are different from each other, but the areas of the main surfaces of the first substrate 20 and the second substrate 21 may be equal to each other. By directly bonding the micro pads (first electrode) formed on the surface of the first substrate 20 and the micro pads (second electrodes) formed on the surface of the second substrate 21 to each other without forming the micro bumps, the first substrate 20 and the second substrate 21 may be connected to each other.

The circuit elements constituting the pixel cells 30 are distributed and arranged in the first substrate 20 and the second substrate 21. The vertical scanning circuit 3, the column processing circuit 4, the horizontal scanning circuit 5, and the output amplifier 6 other than the pixel cells 30 may be arranged in any of the first substrate 20 and the second substrate 21.

The circuit elements constituting the vertical scanning circuit 3, the column processing circuits 4, the horizontal scanning circuit 5, and the output amplifier 6 may be distributed and arranged in the first substrate 20 and the second substrate 21. The elements other than the pixel cells 30 need to transmit and receive a signal between the first substrate 20 and the second substrate 21, but the first substrate 20 and the second substrate 21 may be connected to each other using the micro pads and the micro bumps or the first substrate 20 and the second substrate 21 may be connected to each other by directly bonding the micro pads to each other, similarly to the pixel cells 30

Figure 4A:
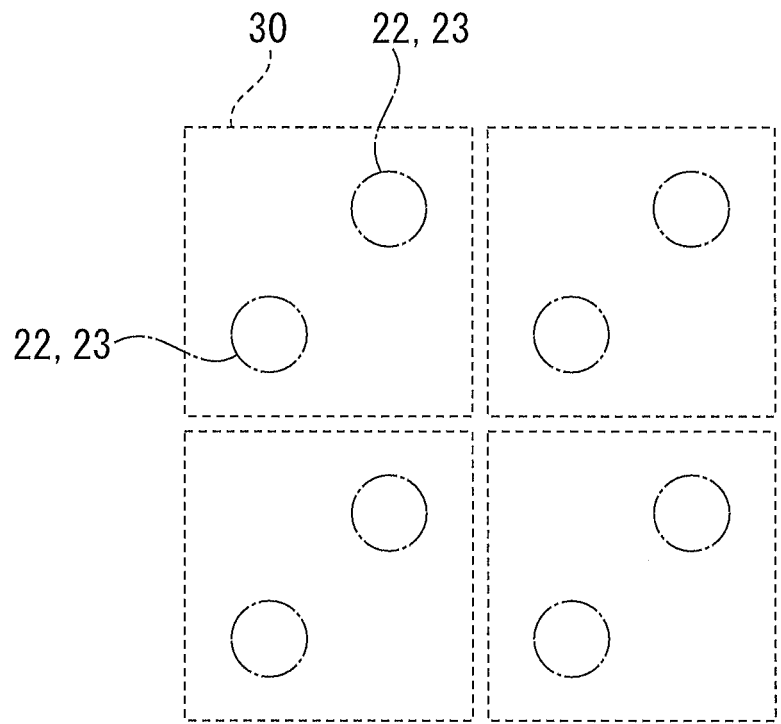
FIG. 4A is a schematic diagram illustrating a planar structure and a cross-sectional structure of a pixel cell according to the first embodiment of the present invention.
Figure 4B:
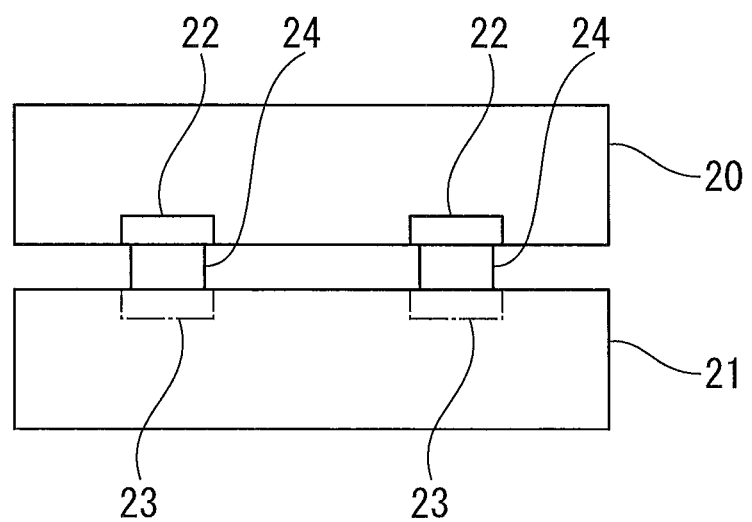
FIG. 4B is a schematic diagram illustrating a planar structure and a cross-sectional structure of a pixel cell according to the first embodiment of the present invention.

FIGS. 4A and 4B illustrate a planar structure (FIG. 4A) and a cross-sectional structure (FIG. 4B) of the pixel cells 30. As illustrated in FIG. 4A, two micro pads 22 are formed on the first substrate 20 for each pixel cell 30, and two micro pads 23 are formed on the second substrate 21 for each pixel cell 30. In this embodiment, the sizes of the micro pads 22 and the micro pads 23 are equal to each other. When the micro pads 22 and the micro pads 23 are projected onto a virtual horizontal plane parallel to the first substrate 20 and the second substrate 21, the same projected image is obtained. As illustrated in FIG. 4B, the micro pads 22 and the micro pads 23 are electrically connected to each other via the micro bumps 24. In the illustrated example, the micro bumps 24 have a cylindrical shape, but are not limited to this shape and may have any shape such as a spherical shape as long as they can electrically connect the micro pads 22 and the micro pads 23 to each other. In the illustrated example, two micro pads 22 and 23 are formed on the first substrate 20 and the second substrate 21 for each pixel cell 30, but this embodiment is not limited to this configuration and three or more micro pads 22 and 23 may be formed.

Figure 5:
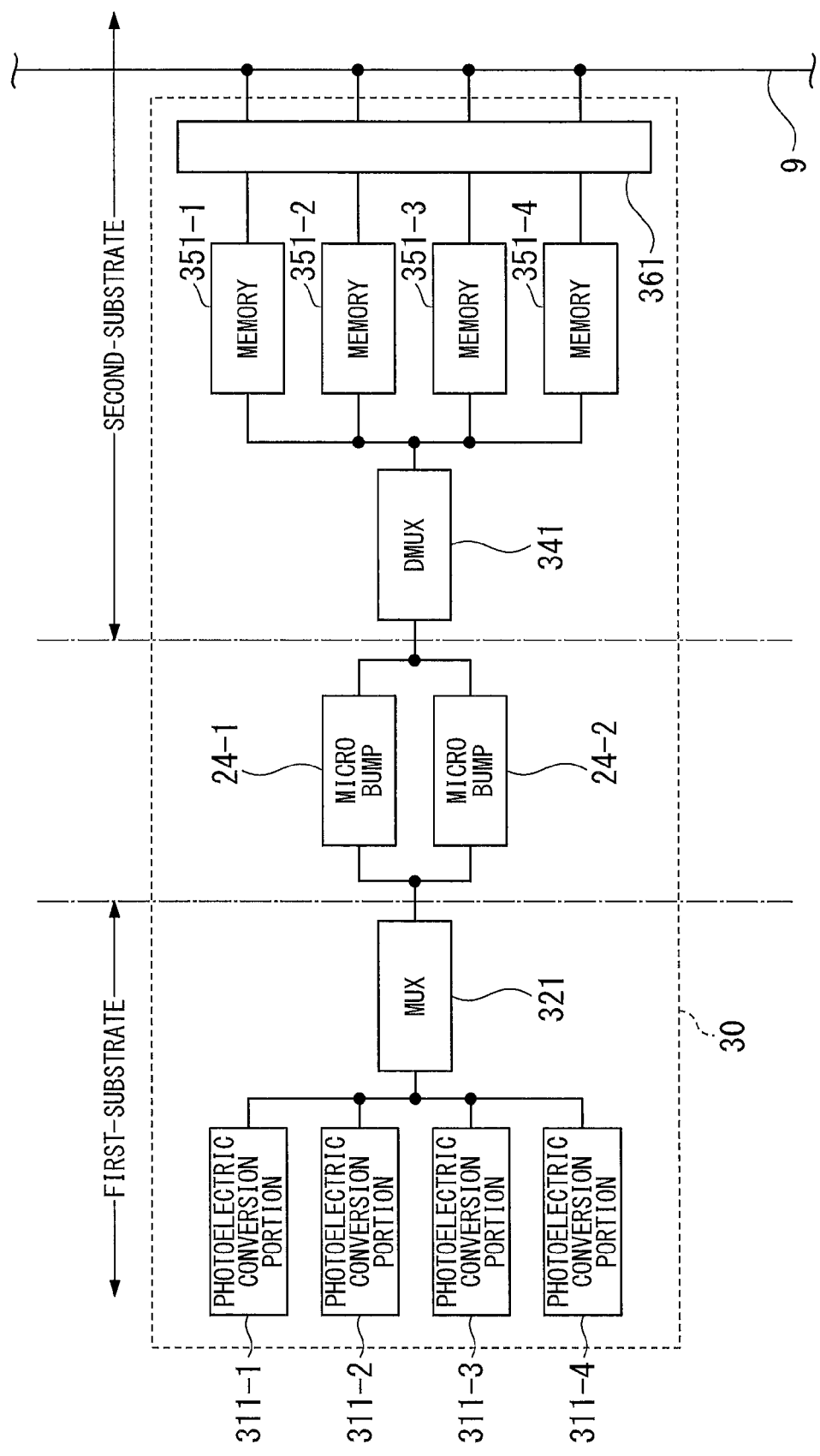
FIG. 5 is a block diagram illustrating a configuration of a pixel cell according to the first embodiment of the present invention.

FIG. 5 illustrates a configuration of a pixel cell 30. In the illustrated example, the pixel cell 30 includes photoelectric conversion portions 311-1 to 311-4, a multiplexer 321, micro bumps 24-1 and 24-2, a demultiplexer 341, memories 351-1 to 351-4, and a row selection circuit 361. The photoelectric conversion portions 311-1 to 311-4 and the multiplexer 321 are arranged on the first substrate 20. The demultiplexer 341, the memories 351-1 to 351-4, and the row selection circuit 361 are arranged on the second substrate 21.

The photoelectric conversion portions 311-1 to 311-4 are formed of, for example, photodiodes and convert incident light into an electrical signal. The multiplexer 321 sequentially outputs the electrical signal converted by the photoelectric conversion portions 311-1 to 311-4 to the demultiplexer 341 via the micro bumps 24-1 and 24-2. In this embodiment, the pixel cell 30 includes two micro bumps 24, that is, the micro bump 24-1 and the micro bump 24-2. Accordingly, for example, even if there is a connection failure in the micro bump 24-1, the electrical signal can be transmitted from the multiplexer 321 of the first substrate 20 to the demultiplexer 341 of the second substrate 21 via the micro bump 24-2.

The demultiplexer 341 sequentially stores the electrical signal input from the multiplexer 321 to the memories 351-1 to 351-4. The row selection circuit 361 sequentially outputs the electrical signals stored in the memories 351-1 to 351-4 to the vertical signal line 9. The constituent elements of the pixel cell 30 are controlled by the vertical scanning circuit 3 illustrated in FIG. 2.

Figure 6:
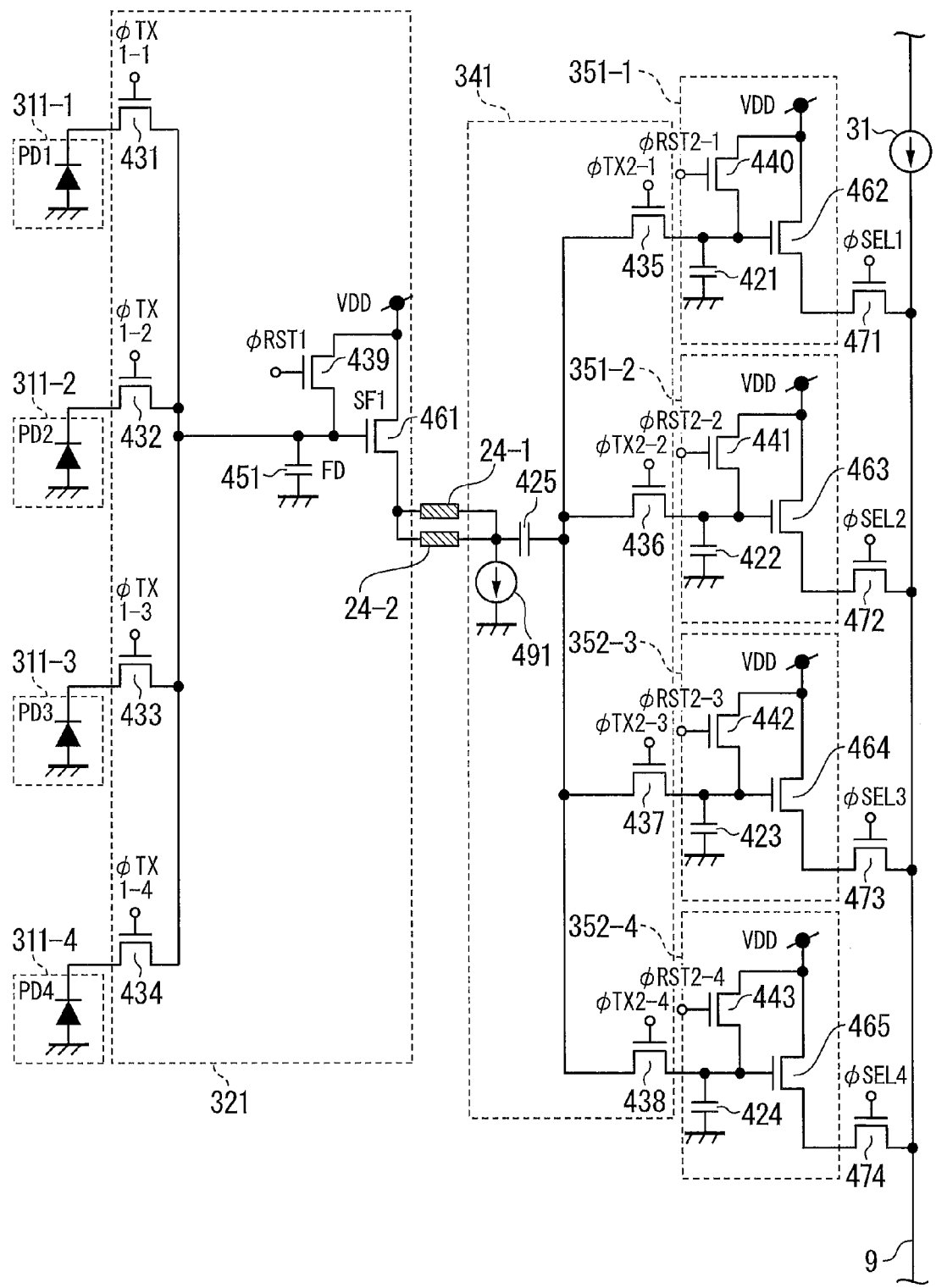
FIG. 6 is a circuit diagram illustrating a circuit configuration of a pixel cell' according to the first embodiment of the present invention.

FIG. 6 illustrates a specific circuit configuration of the pixel cell 30 illustrated in FIG. 5. In the example illustrated in FIG. 6, the configurations corresponding to the constituent elements in FIG. 5 are surrounded by dotted lines. Specifically, photodiodes PD1 to PD4 correspond to the photoelectric conversion portions 311-1 to 311-4. First transfer transistors 431 to 434, a floating diffusion 451 (FD), a first reset transistor 439, and a first amplification transistor 461 (SF1) correspond to the multiplexer 321. A clamp capacitor 425 and second transfer transistors 435 to 438 correspond to the demultiplexer 341. Analog memories 421 to 424, second reset transistors 440 to 443, and second transfer transistors 462 to 465 correspond to the memories 351-1 to 351-4.

One end of each of the photodiodes PD1 to PD4 converting incident light into charges is grounded and the other end of each of the photodiodes PD1 to PD4 is connected to the drain terminal of each of four first transfer transistors 431 to 434 corresponding thereto. The gate terminals of the first transfer transistors 431 to 434 are connected to the vertical scanning circuit 3 and are supplied with transfer pulses φTX1-1 to φTX1-4, respectively.

One end of the floating diffusion 451 is connected to the source terminals of the first transfer transistors 431 to 434 and the other end of the floating diffusion 451 is grounded. The drain terminal of the first reset transistor 439 is connected to the source voltage VDD and the source terminal of the first reset transistor 439 is connected to the source terminals of the first transfer transistors 431 to 434. The gate terminal of the first reset transistor 439 is connected to the vertical scanning circuit 3 and is supplied with a reset pulse φRST1.

The drain terminal of the first amplification transistor 461 is connected to the source voltage VDD. The gate terminal of the first amplification transistor 461 is connected to the source terminals of the first transfer transistors 431 to 434.

The source terminal of the first amplification transistor 461 is connected to the micro pads 22 formed on the first substrate 20.

The micro pads 22 formed on the first substrate 20 and the micro pads 23 formed on the second substrate 21 are connected to each other via the micro bumps 24-1 and 24-2. The micro pads 23 are connected to one end of a current source 491 and one end of a clamp capacitor 425. Through this configuration, one end of the current source 491, one end of the clamp capacitor 425, and the source terminal of the first amplification transistor 461 are connected. The other end of the current source 491 is grounded.

The drain terminals of the second transfer transistors 435 to 438 are connected to the other end of the clamp capacitor 425. The gate terminals of the second transfer transistors 435 to 438 are connected to the vertical scanning circuit 3 and are supplied with transfer pulses φTX2-1 to φTX2-4, respectively.

The drain terminals of the second reset transistors 440 to 443 are connected to the source voltage VDD and the source terminals of the second reset transistors 440 to 443 are connected to the source terminals of the second transfer transistors 435 to 438. The gate terminals of the second reset transistors 440 to 443 are connected to the vertical scanning circuit 3 and are supplied with reset pulses φRST2-1 to φRST2-4, respectively.

One end of each of the analog memories 421 to 424, each of which is formed of a capacitive element, is connected to the source terminal of the corresponding one of the second transfer transistors 435 to 438 and the other end of each of the analog memories 421 to 424 is grounded. The drain terminals of the second amplification transistors 462 to 465 are connected to the source voltage VDD. The gate terminals constituting the input portions of the second amplification transistors 462 to 465 are connected to the source terminals of the second transfer transistors 435 to 438, respectively. The drain terminals of the row selection transistors 471 to 474 are connected to the source terminals of the second amplification transistors 462 to 465, respectively, and the source terminals of the row selection transistors 471 to 474 are connected to the vertical signal line 9. The gate terminals of the row selection transistors 471 to 474 are connected to the vertical scanning circuit 3 and are supplied with selection pulses φSEL1 to φSEL4, respectively. In the above-mentioned transistors, the polarities may be inverted, and the source terminal and the drain terminal may be inverted.

The photodiodes PD1 to PD4 generate signal charges based on incident light and hold and accumulate the generated signal charges. The first transfer transistors 431 to 434 are transistors that transfer the signal charges accumulated in the photodiodes PD1 to PD4 to the floating diffusion 451. The turning-on/off of the first transfer transistors 431 to 434 is controlled by the transfer pulses φTX1-1 to φTX1-4 from the vertical scanning circuit 3. The floating diffusion 451 is a capacitor that temporarily holds and accumulates the signal charges transferred from the photodiodes PD1 to PD4.

The first reset transistor 439 is a transistor that resets the floating diffusion 451. The turning-on/off of the first reset transistor 439 is controlled by the reset pulse φRST1 from the vertical scanning circuit 3. The photodiodes PD1 to PD4 may be reset by simultaneously turning the first reset transistor 439 and the first transfer transistors 431 to 434 on. The resetting of the floating diffusion 451/the photodiodes PD1 to PD4 serves to control an amount of charges accumulated in the floating diffusion 451/the photodiodes PD1 to PD4 so as to set the states (potentials) of the floating diffusion 451/the photodiodes PD1 to PD4 to a reference state (reference potential, reset level).

The first amplification transistor 461 is a transistor that outputs an amplified signal, which is input to the gate terminal and is obtained by amplifying a signal based on the signal charges accumulated in the floating diffusion 451, from the source terminal. The current source 491 functions as a load of the first amplification transistor 461 and supplies a current for driving the first amplification transistor 461 to the first amplification transistor 461. The first amplification transistor 461 and the current source 491 constitute a source follower circuit.

The clamp capacitor 425 is a capacitor that clamps (fixes) the voltage level of the amplified signal output from the first amplification transistor 461. The second transfer transistors 435 to 438 are transistors that sample and hold the voltage level of the other end of the clamp capacitor 425 and accumulate the voltage level in the analog memories 421 to 424. The turning-on/off of the second transfer transistors 435 to 438 is controlled by the transfer pulses φTX2-1 to φTX2-4 from the vertical scanning circuit 3.

The second reset transistors 440 to 443 are transistors that reset the analog memories 421 to 424. The resetting of the analog memories 421 to 424 serves to control amounts of charges accumulated in the analog memories 421 to 424 so as to set the states (potentials) of the analog memories 421 to 424 to a reference state (reference potential, reset level). The analog memories 421 to 424 hold and accumulate analog signals sampled and held by the second transfer transistors 435 to 438.

The capacitance of the analog memories 421 to 424 is set to capacitance greater than the capacitance of the floating diffusion 451. It is preferable that a metal insulator metal (MIM) capacitor and a metal oxide semiconductor (MOS) capacitor which is a capacitor having a small leak current (dark current) per unit area be used for the analog memories 421 to 424. Accordingly, resistance to noise is improved and a signal with high quality is obtained.

The second transfer transistors 462 to 465 are transistors that output an amplified signal, which is input to the gate terminal and is obtained by amplifying the signal based on the signal charges accumulated in the analog memories 421 to 424, from the source terminal. The second transfer transistors 462 to 465 and the current source 31 connected to the vertical signal line 9 constitute a source follower circuit. The row selection transistors 471 to 474 are transistors that select pixels and transfer the outputs of the second transfer transistors 462 to 465 to the vertical signal line 9. The turning-on/off of the row selection transistors 471 to 474 is controlled by the selection pulses φSEL1 to φSEL4 from the vertical scanning circuit 3.

In the example illustrated in FIG. 6, the photodiodes PD1 to PD4, the first transfer transistors 431 to 434, the floating diffusion 451, the first reset transistor 439, and the first amplification transistor 461 are arranged on the first substrate 20. The current source 491, the clamp capacitor 425, the second transfer transistors 435 to 438, the second reset transistors 440 to 443, the analog memories 421 to 424, the second transfer transistors 462 to 465, and the row selection transistors 471 to 474 are arranged on the second substrate 21.

The amplified signal output from the first amplification transistor 461 of the first substrate 20 is output to the second substrate 21 via the micro pads 22, the micro bumps 24-1 and 24-2, and the micro pads 23. The source voltage VDD is transmitted and received between the first substrate 20 and the second substrate 21 via the micro pads 25, the micro bumps 27, and the micro pads 26.

In FIG. 6, the micro pads 22, the micro bumps 24-1 and 24-2, and the micro pads 23 are arranged in a path among the source terminal of the first amplification transistor 461, one end of the current source 491, and one end of the clamp capacitor 425, but this embodiment is not limited to this configuration. The micro pads 22, the micro bumps 24, and the micro pads 23 may be arranged in any of a path electrically connected from the photodiodes PD1 to PD4 to the analog memories 421 to 424.

Figure 7:
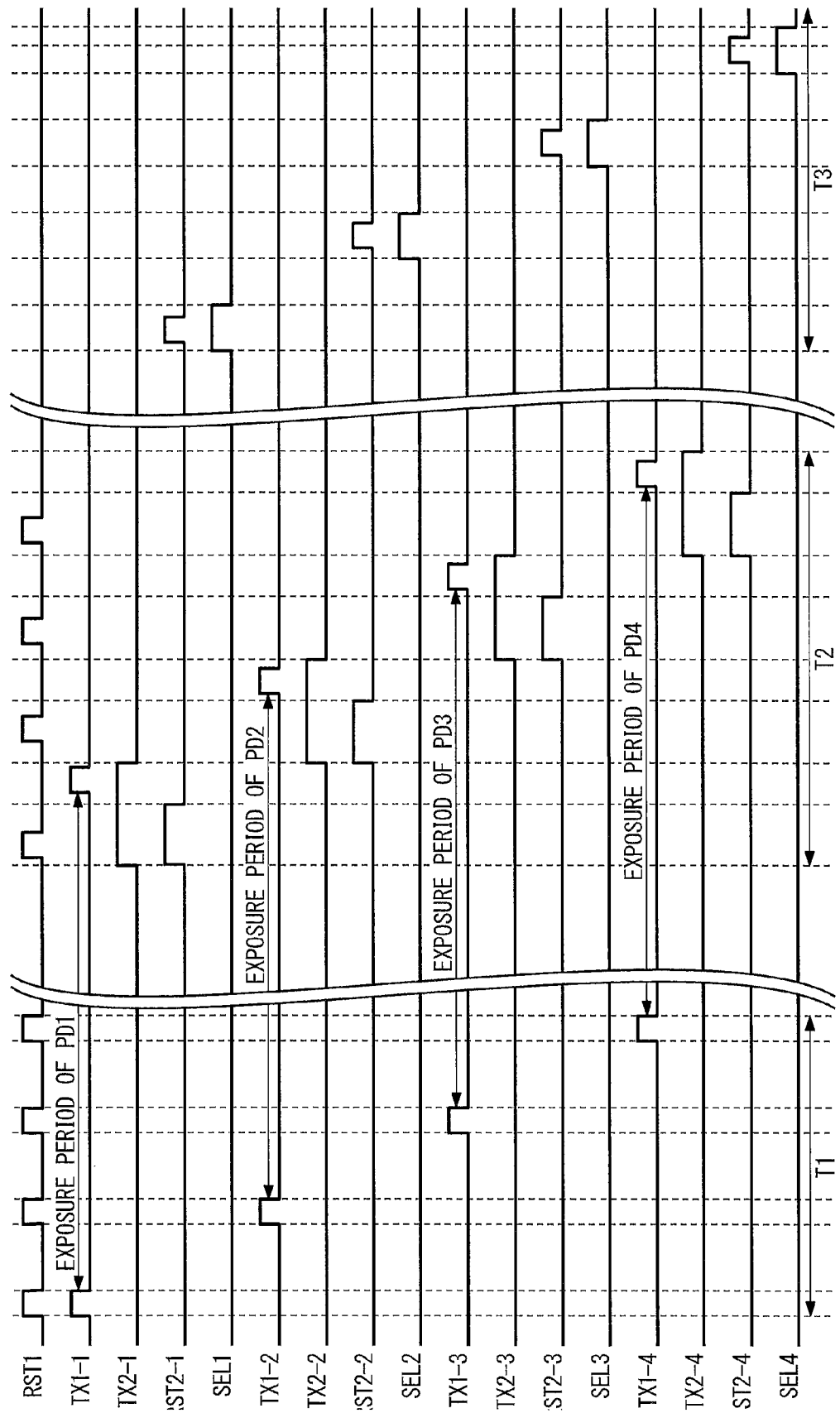
FIG. 7 is a timing diagram illustrating operations of the solid-state imaging device according to the first embodiment of the present invention.

The operation of the solid-state imaging device 202 will be described below with reference to FIG. 7. FIG. 7 illustrates a control signal supplied from the vertical scanning circuit 3 to a pixel cell 30 for each row. The operation of a pixel cell 30 when a single pixel cell 30 includes four photodiodes PD1 to PD4 will be described.

In the plurality of pixel cells 30, the operation start timings (the start timings of period T1 in FIG. 7) are the same.

[Operation in Period T1]

Period T1 is a reset period and the photodiodes PD1 to PD4 are reset in this period. First, the reset pulse φRST1 is switched to a high level and the transfer pulse φTX1-1 of each pixel cell 30 is switched to a high level. Accordingly, the voltage of the photodiode PD1 is reset to have the same potential as the source voltage.

Then, the transfer pulse φTX1-1 is switched to a low level and the transfer pulse φTX1-2 is switched to a high level. Accordingly, the potential of the photodiode PD2 is reset to have the same potential as the source voltage. Similarly, by sequentially switching the transfer pulses φTX1-3 and φTX1-4 to a high level, the photodiodes PD3 and PD4 are reset. In the reset period of period T1, the reset pulse φRST1 may normally be at a high level or may be switched to the high level at the timing at which the transfer pulses φTX1-1 to φTX1-4 are switched to the high level. When this reset operation ends, the photodiodes PD1 to PD4 start exposure.

[Operation in Period T2]

Period T2 is a period in which a clamping operation and a memory operation are performed after a desired exposure period elapses. After the desired exposure period elapses, the reset pulses φRST1 and φRST2-1 and the transfer pulse φTX2-1 are switched to a high level. Accordingly, the voltage signal when the floating diffusion 451 is reset is clamped by the clamp capacitor 425. Then, the reset pulses φRST1 and φRST2-1 are switched to a low level and the transfer pulse φTX1-1 is switched to a high level. Accordingly, the signal charges corresponding to the charges accumulated in the photodiode PD1 are transferred to the floating diffusion 451. The floating diffusion 451 accumulates the charges transferred from the photodiode PD1 and outputs a voltage corresponding to the accumulated charges. At this time, the voltage corresponding to the charges accumulated in the floating diffusion 451 is stored in the analog memory 421. The transfer pulse φTX1-1 is switched to a low level, the transfer pulse φTX2-1 is switched to a low level, and the memory operation ends.

The transfer pulses φTX1-2 and φTX2-2, the reset pulse φRST2-2, the transfer pulses φTX1-3 and φTX2-3, the reset pulse φRST2-3, the transfer pulses φTX1-4 and φTX2-4, and the reset pulse φRST2-4 are operated in the same way, and the voltages corresponding to the charges accumulated in the photodiodes PD2 to PD4 are stored in the analog memories 422 to 424.

[Operation in Period T3]

Period T3 is a reading period. When reading an electrical signal, the electrical signals are simultaneously output from the pixel cells 30 in the same row to the vertical signal line 9 for each column. In period T3, first, the row selection pulse φSEL1 is switched to a high level and a signal based on the voltage stored in the analog memory 421 is input to the column processing circuit 4 via the vertical signal line 9. The reset pulse φRST2-1 is switched to a high level and a signal based on the voltage when the analog memory 421 is reset is input to the column processing circuit 4 via the vertical signal line 9. The column processing circuit 4 generates an electrical signal which is based on the signal charges accumulated in the photodiode PD1 and subjected to noise reduction or the like using the input signal. The column processing circuit 4 inputs the generated electrical signal to the horizontal scanning circuit 5. The horizontal scanning circuit 5 sequentially outputs the input electrical signal to the output amplifier 6. Accordingly, the electrical signal based on the signal charges accumulated in the photodiode PD1 can be read.

The row selection pulse φSEL2, the reset pulse φRST2-2, the row selection pulse φSEL3, the reset pulse φRST2-3, the row selection pulse φSEL4, and the reset pulse φRST2-4 are operated in the same way, and the electrical signals based on the signal charges accumulated in the photodiodes PD2 to PD4 are sequentially read. Accordingly, the solid-state imaging device 202 can capture an image with reduced degradation in signal quality.

As described above, in the solid-state imaging device 202, the circuit elements constituting each pixel cell 30 including a plurality of pixels are arranged in two substrates and a plurality of connecting portions (micro bumps 24, 24-1, and 24-2) electrically connecting the two substrates are shared in a single pixel cell 30. Through this configuration, for example, even if the connection of one connecting portion out of the plurality of connecting portions fails, the other connecting portion is present and thus the electrical connection between the two substrates is maintained. Accordingly, since the plurality of connecting portions are shared in a single pixel cell 30, it is possible to improve reliability of electrical connection between two substrates without requiring development of a miniaturization technique for the connecting portions. In the solid-state imaging device 202, since the circuit elements constituting each pixel cell 30 including the plurality of pixels are arranged in two substrates and the two substrates overlap, it is possible to suppress an increase in chip area.

Accordingly, in the solid-state imaging device 202 according to this embodiment, it is possible to obtain an image with higher quality, to reduce degradation in signal quality, and to suppress an increase in chip area.

Second Embodiment

A second embodiment of the present invention will be described below with reference to the accompanying drawings. The configuration of an imaging device according to this embodiment is the same as the configuration of the imaging device according to the first embodiment. The configuration of a solid-state imaging device 202 according to this embodiment is the same as the configuration of the solid-state imaging device 202 according to the first embodiment. This embodiment is different from the first embodiment in a relationship between the positions of the micro pads 22 formed on the first substrate 20 for each pixel cell 30 and the positions of the micro pads 23 formed on the second substrate 21.

Figure 8A:
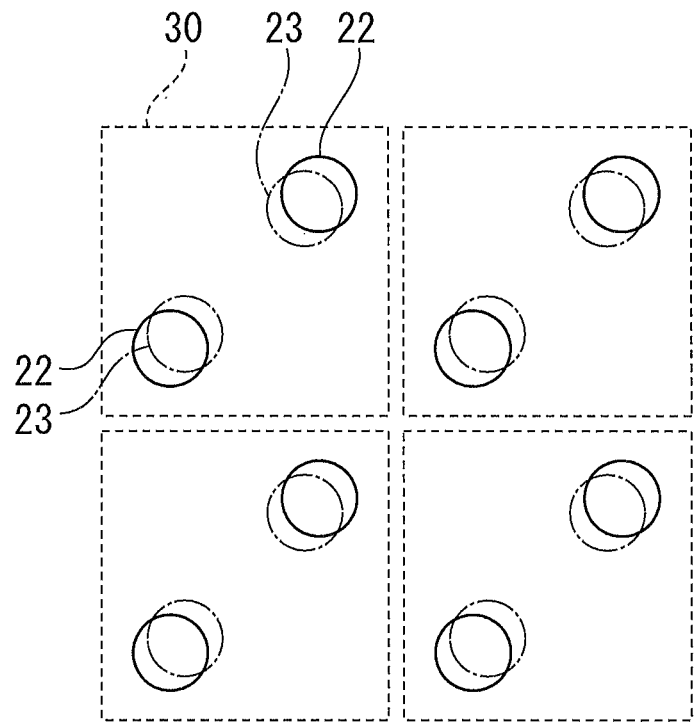
FIG. 8A is a schematic diagram illustrating a planar structure and a cross-sectional structure of a pixel cell according to a second embodiment of the present invention.
Figure 8B:
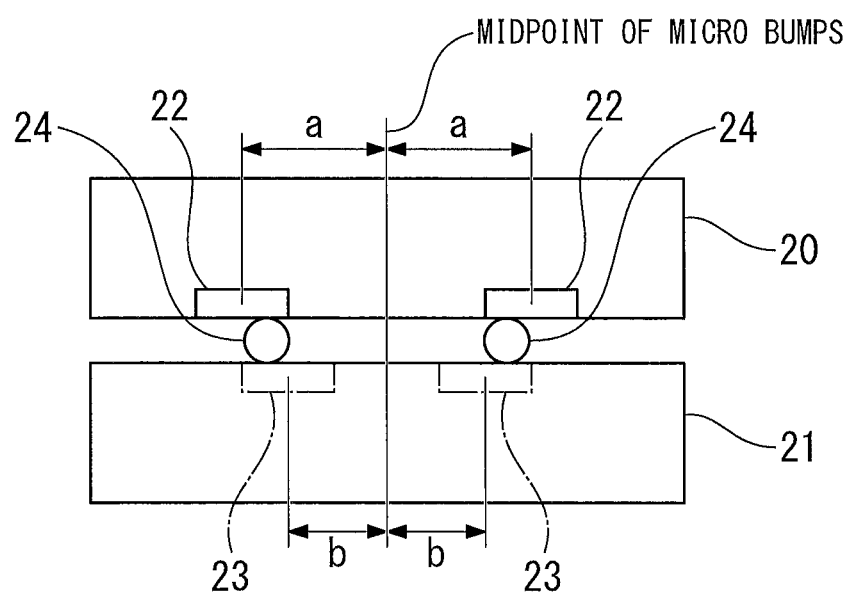
FIG. 8B is a schematic diagram illustrating a planar structure and a cross-sectional structure of a pixel cell according to the second embodiment of the present invention.

FIGS. 8A and 8B illustrate a planar structure (FIG. 8A) and a cross-sectional structure (FIG. 8B) of pixel cells 30. As illustrated in FIG. 8A, two micro pads 22 are formed on the first substrate 20 for each pixel cell 30, and two micro pads 23 are formed on the second substrate 21 for each pixel cell 30. In this embodiment, the sizes of the micro pads 22 and the micro pads 23 are equal to each other. When the micro pads 22 and the micro pads 23 are projected onto a virtual horizontal plane parallel to the first substrate 20 and the second substrate 21, a projected image in which parts thereof overlap is obtained.

A distance a illustrated in FIG. 8B is a distance from a midpoint of two micro bumps 24 of the pixel cell 30 to each micro pad 22 formed on the first substrate 20. A distance b is a distance from a midpoint of two micro bumps 24 of the pixel cell 30 to each micro pad 23 formed on the second substrate 21. In this embodiment, the micro pads 22 and 23 are formed such that the distance a and the distance b are different from each other. In the illustrated example, a>b is established but b>a may be established.

As illustrated in FIG. 8B, the micro pads 22 and the micro pads 23 are electrically connected to each other via the micro bumps 24. In the illustrated example, the micro bumps 24 have a spherical shape, but is not limited to this shape and may have any shape such as a cylindrical shape as long as it can electrically connect the micro pads 22 and the micro pads 23 to each other.

Figure 9A:
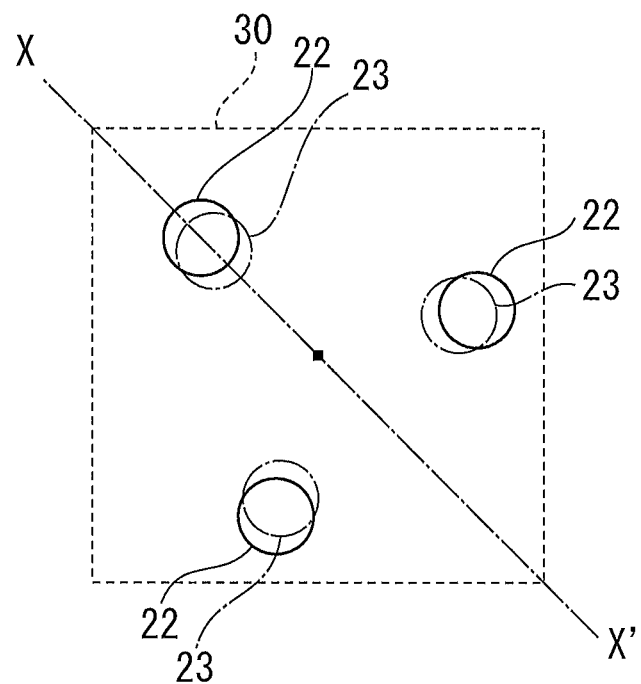
FIG. 9A is a schematic diagram illustrating a planar structure and a cross-sectional structure of a pixel cell according to the second embodiment of the present invention.
Figure 9B:
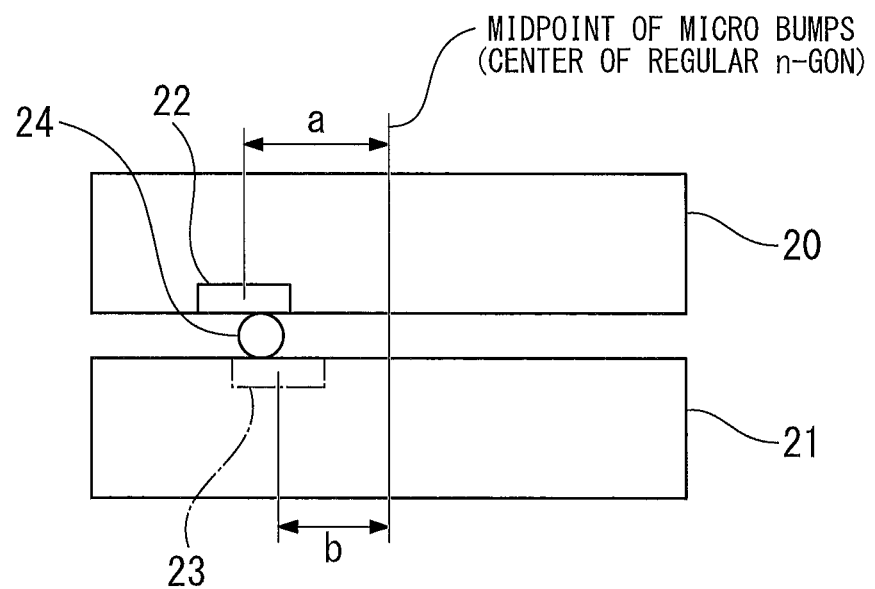
FIG. 9B is a schematic diagram illustrating a planar structure and a cross-sectional structure of a pixel cell according to the second embodiment of the present invention.

FIGS. 9A and 9B illustrate a planar structure (FIG. 9A) and a cross-sectional structure (FIG. 9B) of a pixel cell 30 when three micro pads 22 and 23 are formed on the first substrate 20 and the second substrate 21 for each pixel cell 30. As illustrated in FIG. 9A, three micro pads 22 are formed on the first substrate 20 for each pixel cell 30, and three micro pads 23 are formed on the second substrate 21 for each pixel cell 30. In this embodiment, the sizes of the micro pads 22 and the micro pads 23 are equal to each other. When the micro pads 22 and the micro pads 23 are projected onto a virtual horizontal plane parallel to the first substrate 20 and the second substrate 21, a projected image in which parts thereof overlap is obtained. The three micro pads 22 and the three micro pads 23 each form an equilateral triangle.

A distance a illustrated in FIG. 9B is a distance from a midpoint of three micro bumps 24 of the pixel cell 30 to each micro pad 22 formed on the first substrate 20. A distance b is a distance from a midpoint of three micro bumps 24 of the pixel cell 30 to each micro pad 23 formed on the second substrate 21. In this embodiment, the micro pads 22 and 23 are formed such that the distance a and the distance b are different from each other. In the illustrated example, a>b is established but b>a may be established.

As illustrated in FIG. 9B, the micro pads 22 and the micro pads 23 are electrically connected to each other via the micro bumps 24. In the illustrated example, the micro bumps 24 have a spherical shape, but are not limited to this shape and may have any shape such as a cylindrical shape as long as they can electrically connect the micro pads 22 and the micro pads 23 to each other.

In the illustrated example, three micro pads 22 and 23 are formed on the first substrate 20 and the second substrate 21 for each pixel cell 30, but this embodiment is not limited to this example and n micro pads 22 and 23 (where n is equal to or greater than 4) may be formed. In this case, the n micro pads 22 and the n micro pads 23 each form a regular n-gon.

As described above, according to this embodiment, the distance from the midpoint of two or more micro bumps 24 of each pixel cell 30 to each micro pad 22 formed on the first substrate 20 and the distance from the midpoint of two or more micro bumps 24 of each pixel cell 30 to each micro pad 22 formed on the second substrate 21 are different from each other. Through this configuration, even if positional displacement occurs depending on bonding accuracy when the first substrate 20 and the second substrate 21 are bonded to each other, the total connection area does not vary. For example, even when the connection area between the micro pads 22 and 23 and the micro bump 24 on one side increases and the connection area between the micro pads 22 and 23 and the micro bump 24 on the other side decreases, the total connection area does not vary.

Accordingly, it is possible to suppress unevenness in the connection area between the first substrate 20 and the second substrate 21. Accordingly, in the solid-state imaging device 202 according to this embodiment, it is possible to obtain an image with higher quality, to reduce degradation in signal quality, and to suppress an increase in chip area.

Third Embodiment

A third embodiment of the present invention will be described below with reference to the accompanying drawings. The configuration of an imaging device according to this embodiment is the same as the configuration of the imaging device according to the first embodiment. The configuration of a solid-state imaging device 202 according to this embodiment is the same as the configuration of the solid-state imaging device 202 according to the first embodiment. This embodiment is different from the first embodiment, in that the size of the micro pads 22 formed on the first substrate 20 for each pixel cell 30 and the size of the micro pads 23 formed on the second substrate 21 are different from each other.

Figure 10A:
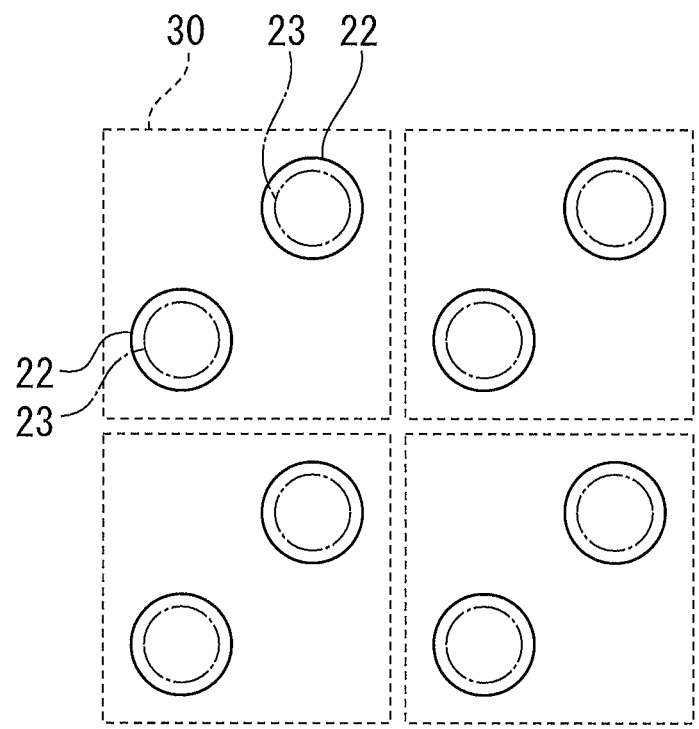
FIG. 10A is a schematic diagram illustrating a planar structure and a cross-sectional structure of a pixel cell according to a third embodiment of the present invention.

FIG. 10A illustrates a planar structure (FIG. 10A) and a cross-sectional structure (FIG. 10B) of pixel cells 30. As illustrated in FIG. 10A, two micro pads 22 are formed on the first substrate 20 for each pixel cell 30, and two micro pads 23 are formed on the second substrate 21 for each pixel cell 30. In this embodiment, the sizes of the micro pads 22 and the micro pads 23 are different from each other. When the micro pads 22 and the micro pads 23 are projected onto a virtual horizontal plane parallel to the first substrate 20 and the second substrate 21, a projected image in which the micro pads 23 are included in the micro pads 22 is obtained. In the illustrated example, the size of the micro pads 22>the size of the micro pads 23 is established, but the size of the micro pads 23>the size of the micro pads 22 may be established. In this case, when the micro pads 22 and the micro pads 23 are projected onto a virtual horizontal plane parallel to the first substrate 20 and the second substrate 21, a projected image in which the micro pads 22 are included in the micro pads 23 is obtained.

Figure 10B:
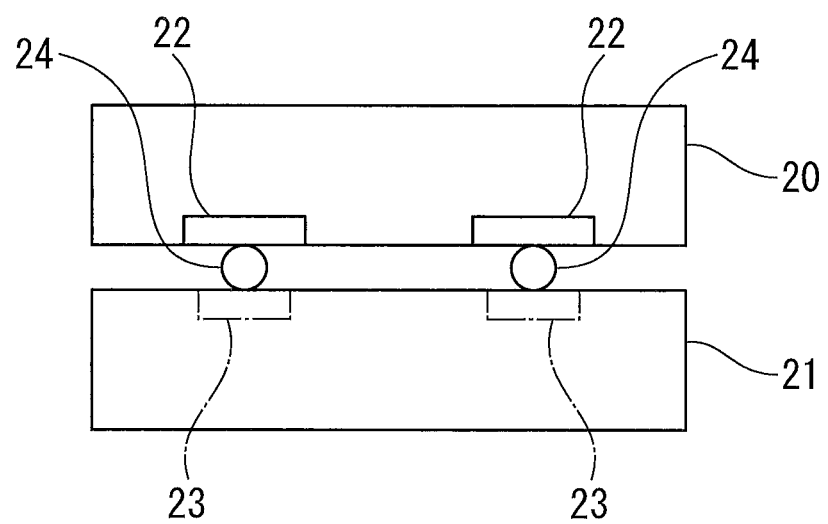
FIG. 10B is a schematic diagram illustrating a planar structure and a cross-sectional structure of a pixel cell according to the third embodiment of the present invention.

As illustrated in FIG. 10B, the micro pads 22 and the micro pads 23 are electrically connected to each other via the micro bumps 24. In the illustrated example, the micro bumps 24 have a spherical shape, but are not limited to this shape and may have any shape such as a spherical shape as long as they can electrically connect the micro pads 22 and the micro pads 23 to each other. In the illustrated example, two micro pads 22 and 23 are formed on the first substrate 20 and the second substrate 21, respectively, for each pixel cell 30, but this embodiment is not limited to this example and three or more micro pads 22 and 23 may be formed.

As described above, according to this embodiment, the size of the micro pads 22 is different from the size of the micro pads 23. Through this configuration, even if positional displacement occurs depending on bonding accuracy when the first substrate 20 and the second substrate 21 are bonded to each other, the connection area does not vary. Accordingly, it is possible to suppress unevenness in the connection area between the first substrate 20 and the second substrate 21. Accordingly, in the solid-state imaging device 202 according to this embodiment, it is possible to obtain an image with higher quality, to reduce degradation in signal quality, and to suppress an increase in chip area.

Fourth Embodiment

A fourth embodiment of the present invention will be described below with reference to the accompanying drawings. The configuration of an imaging device according to this embodiment is the same as the configuration of the imaging device according to the first embodiment. The configuration of a solid-state imaging device 202 according to this embodiment is the same as the configuration of the solid-state imaging device 202 according to the first embodiment. This embodiment is different from the first embodiment in that the size and the number of the micro pads 22 formed on the first substrate 20 for each pixel cell 30 differ.

Figure 11A:
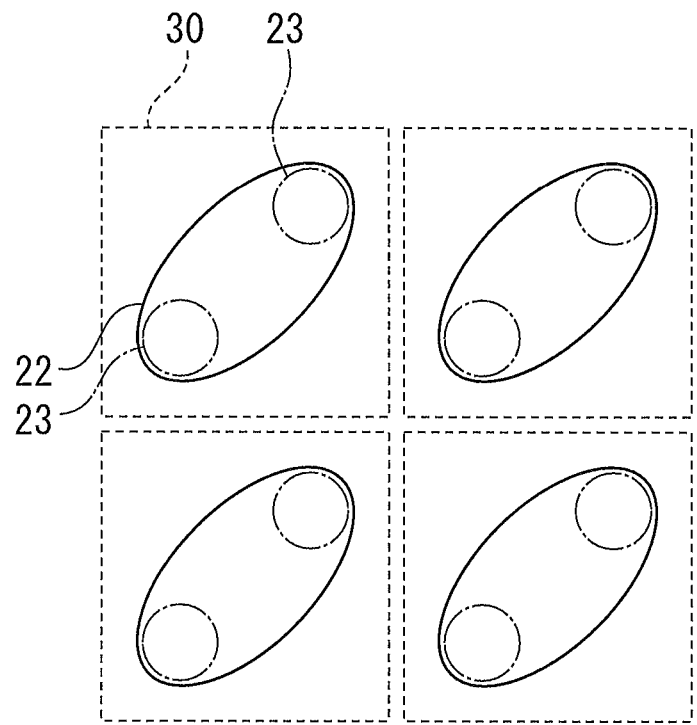
FIG. 11A is a schematic diagram illustrating a planar structure and a cross-sectional structure of a pixel cell according to a fourth embodiment of the present invention.
Figure 11B:
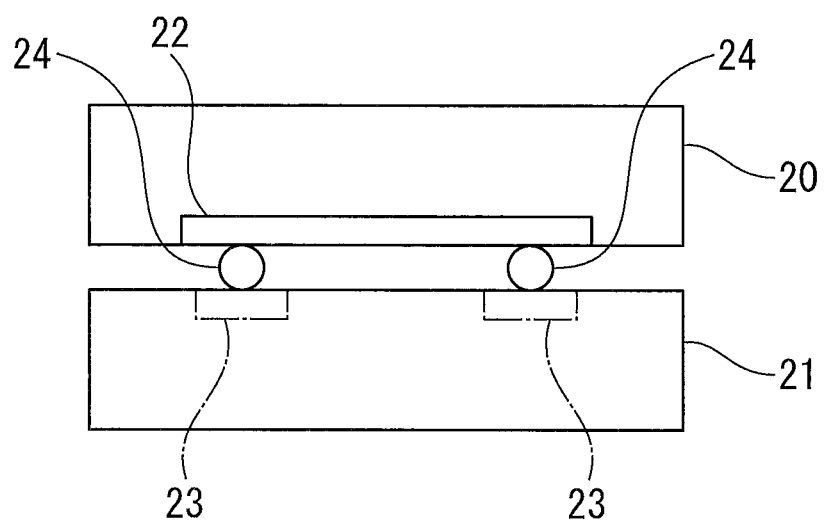
FIG. 11B is a schematic diagram illustrating a planar structure and a cross-sectional structure of a pixel cell according to the fourth embodiment of the present invention.

FIGS. 11A and 11B illustrate a planar structure (FIG. 11A) and a cross-sectional structure (FIG. 11B) of pixel cells 30. As illustrated in FIG. 11A, a single micro pad 22 is formed on the first substrate 20 for each pixel cell 30, and two micro pads 23 are formed on the second substrate 21 for each pixel cell 30. In this embodiment, the sizes of the micro pad 22 and the micro pads 23 are different from each other. When the micro pad 22 and the micro pads 23 are projected onto a virtual horizontal plane parallel to the first substrate 20 and the second substrate 21, a projected image in which the two micro pads 23 are included in the single micro pad 22 is obtained.

In the illustrated example, the two micro pads 23 are formed, but three or more micro pads 23 may be formed. In the illustrated example, the single micro pad 22 is formed, the two micro pads 23 are formed, and the size of the micro pad 22>the size of the micro pads 23 is established, but two or more micro pads 22 may be formed, a single micro pad 23 may be formed, and the size of the micro pad 23>the size of the micro pads 22 may be established. In this case, when the micro pads 22 and the micro pads 23 are projected onto a virtual horizontal plane parallel to the first substrate 20 and the second substrate 21, a projected image in which the two or more micro pads 22 are included in the single micro pad 23 is obtained.

As illustrated in FIG. 11B, the micro pad 22 and the micro pads 23 are electrically connected to each other via the micro bumps 24. In the illustrated example, the micro bumps 24 have a spherical shape, but are not limited to this shape and may have any shape such as a cylindrical shape as long as they can electrically connect the micro pads 22 and the micro pads 23 to each other.

As described above, according to this embodiment, the number of the micro pads 22 and the number of micro pads 23 are different from each other, and the size of the micro pads 22 and the size of the micro pads 23 are different from each other. The projected image in which the two micro pads 23 are included in the single micro pad 22 is obtained when the micro pads 22 and the micro pads 23 are projected onto a virtual horizontal plane parallel to the first substrate 20 and the second substrate 21, or the projected image in which the two micro pads 22 are included in the single micro pad 23 is obtained when the micro pads 22 and the micro pads 23 are projected onto a virtual horizontal plane parallel to the first substrate 20 and the second substrate 21.

Through this configuration, even if positional displacement occurs depending on bonding accuracy when the first substrate 20 and the second substrate 21 are bonded to each other, the connection area does not vary. Accordingly, it is possible to suppress unevenness in the connection area between the first substrate 20 and the second substrate 21. Since a stress applied when the substrates are bonded is dispersed on the substrate side on which the large micro pads 22 and 23 are formed, it is possible to reduce an influence on devices such as the photoelectric conversion portions 311-1 to 311-4 and the transistors. Accordingly, in the solid-state imaging device 202 according to this embodiment, it is possible to obtain an image with higher quality, to reduce degradation in signal quality, and to suppress an increase in chip area. Since the photoelectric conversion portions 311-1 to 311-4 are formed on the first substrate 20, it is preferable that the micro pads 22 on the first substrate on the first substrate 20 be formed to be larger.

While embodiments of the present invention have been described with reference to the accompanying drawings, the specific configuration thereof is not limited to these embodiments and includes changes in design that do not depart from the gist of the present invention.

For example, in the solid-state imaging device according to this embodiment, two substrates may be connected to each other via the micro pads and the micro bumps or three or more substrates may be connected to each other via the micro pads and the micro bumps. In a solid-state imaging device in which three or more substrates are connected to each other via the micro pads and the micro bumps, two substrates thereof correspond to the first substrate and the second substrate described in the appended claims.

For example, a solid-state imaging device according to an aspect of the present invention includes: first electrode means that are formed on a first substrate on which a plurality of photoelectric conversion elements included in pixels are arranged; second electrode means that are formed on a second substrate having a reading unit that reads signals of the pixels; and connecting means, one end of each of which is bonded to the first electrode means and the other end of each of which is bonded to the second electrode means to electrically connect the first electrode means and the second electrode means to each other, wherein the plurality of pixels are partitioned into a plurality of areas for each unit pixel cell or each cell including a plurality of pixels, first to n-th of the first electrode means and first to m-th of the second electrode means (where n and in are integers equal or greater than 1) are allocated to the partitioned areas, and the first to n-th first electrode means and the first to m-th second electrode means allocated to the same partitioned area are electrically connected to each other via the plurality of connecting means.

A computer program product that realizes an arbitrary combination of the constituent elements or the processes is effective as an aspect of the present invention. The computer program product is a recording medium, a device, an instrument, or a system including program codes, such as a recording medium (such as a DVD medium, a hard disk medium, and a memory medium) on which program codes are recorded, a computer on which program codes are recorded, and an Internet system (for example, a system including a server and a client terminal) on which program codes are recorded. In this case, the constituent elements or the processes are mounted as modules and program codes including the mounted modules are recorded on the computer program product.

For example, according to an aspect of the present invention, there is provided a computer program product on which program codes causing a computer to execute a process of reading a signal from the pixels in a solid-state imaging device having: first electrode pads that are formed on a first substrate on which a plurality of photoelectric conversion elements included in pixels are arranged; second electrode pads that are formed on a second substrate having a reading unit that reads signals of the pixels; and connecting portions, one end of each of which is bonded to the first electrode pads and the other end of each of which is bonded to the second electrode pads to electrically connect the first electrode pads and the second electrode pads to each other, wherein the plurality of pixels are partitioned into a plurality of areas for each unit pixel cell or each cell including a plurality of pixels, first to n-th of the first electrode pads and first to m-th of the second electrode pads (where n and m are integers equal or greater than 1) are allocated to the partitioned areas, and the first to n-th first electrode pads and the first to m-th second electrode pads allocated to the same partitioned area are electrically connected to each other via the plurality of connecting portions, are recorded. A program code including a reading step of causing the reading unit to read a signal generated from the photoelectric conversion elements arranged on the first substrate via the first electrode pads, the connecting portions, and the second electrode pads may be recorded on the computer program product.

A program that realizes an arbitrary combination of the constituent elements or the processes according to the above-mentioned embodiments is effective as an aspect of the present invention. The object of the present invention can be achieved by recording the program on a computer-readable recording medium and causing a computer to read and execute the program recorded on the recording medium.

Here, the "computer" may include a homepage providing environment (or display environment) when a WWW system is used. Examples of the "computer-readable recording medium" include a portable medium such as a flexible disk, a magneto-optical disc, a ROM, and a CD-ROM and a storage device such as a hard disk built in a computer. The "computer-readable recording medium" may include a medium that temporarily holds a program for a predetermined time, like a volatile memory (RAM) in a computer system serving as a server or a client when a program is transmitted via a network such as the Internet or a communication circuit such as a telephone circuit.

The program may be transmitted from a computer system storing the program in a storage device or the like to another computer system via a transmission medium or by transmission waves in the transmission medium. Here, the "transmission medium" via which the program is transmitted means a medium having a function of transmitting information such as a network (communication network) such as the Internet or a communication circuit (communication line) such as a telephone line. The program may be configured to realize some of the above-mentioned functions or may be configured to realize the above-mentioned functions in combination with a program recorded in advance in a computer system, like a so-called differential file (differential program).

While exemplary embodiments of the present invention have been described, various substitutions, modifications, and equivalents can be used in the above-mentioned constituent elements or processes. In the embodiments described in this specification, in order to perform one or more functions, one component may be substituted with plural components or plural components may be substituted with one component. Aside from cases in which such substitutions prevent the object of the present invention from being appropriately achieved, such substitutions are in the scope of the present invention. Therefore, the scope of the present invention should not be determined with reference to the above-mentioned description, but with reference to the appended claims, and includes the entire scope of the equivalents thereof. In the claims, each constituent element may include one or more constituent elements unless explicitly mentioned otherwise. Unless a constituent element is mentioned explicitly using a term such as "means for" in the claims, the claims should not be analyzed to include the definition of means plus function.

The terms in this specification are merely used to describe specific embodiments, and are not be used to limit the present invention. In this specification, even when a singular term is used, the term includes a plural number unless the context clearly indicates otherwise.

According to the solid-state imaging device, the imaging device, and the signal reading method according to the present invention, it is possible to obtain an image with higher quality.

What is claimed is:

1. A solid-state imaging device comprising:
first electrode pads that are formed on a first substrate on which a plurality of photoelectric conversion elements included in pixels are arranged;
second electrode pads that are formed on a second substrate having a reading unit that reads signals of the pixels; and
connecting portions, one end of each of which is bonded to the first electrode pads and the other end of each of which is bonded to the second electrode pads to electrically connect the first electrode pads and the second electrode pads to each other,
wherein the plurality of pixels are partitioned into a plurality of areas for each unit pixel cell or each cell including a plurality of pixels, first to n-th of the first electrode pads and first to m-th of the second electrode pads (where n and m are integers equal or greater than 1) are allocated to the partitioned areas, and the first to n-th first electrode pads and the first to m-th second electrode pads allocated to the same partitioned area are electrically connected to each other via the plurality of connecting portions, and
signals transmitted from the first to n-th first electrode pads to the first to m-th second electrode pads are the same.

2. The solid-state imaging device according to claim 1, wherein the plurality of first electrode pads are disposed on the first substrate,
wherein the same number of second electrode pads as the first electrode pads are disposed on the second substrate, and
wherein a position of a midpoint of the plurality of first electrode pads on the first substrate and a position of a midpoint of the plurality of second electrodes on the second substrate are the same, and a distance between the plurality of first electrode pads and a distance between the plurality of second electrodes are different from each other.

3. The solid-state imaging device according to claim 2, wherein the n (where n is an integer equal to or greater than 3) first electrode pads disposed on the first substrate are arranged to form a regular n-gon in a projection figure from the top surface of the first substrate,
wherein the n second electrode pads disposed on the second substrate are arranged to form a regular n-gon in a projection figure from the top surface of the second substrate, and
wherein a length of one side of the regular n-gon formed by the first electrode pads and a length of one side of the regular n-gon formed by the second electrode pads are different from each other.

4. The solid-state imaging device according to claim 3, wherein the central position of the regular n-gon formed by the first electrode pads which are arranged to form the regular n-gon in the projection figure from the top surface of the first substrate and the central position of the regular n-gon formed by the second electrode pads which are arranged to form the regular n-gon in the projection figure from the top surface of the second substrate are the same.

5. The solid-state imaging device according to claim 1, wherein the sizes of the first electrode pads and the sizes of the second electrode pads are different from each other.

6. The solid-state imaging device according to claim 1, wherein the number of first electrode pads and the number of second electrode pads in the same partitioned area are different from each other.

7. The solid-state imaging device according to claim 6, wherein the number of first electrode pads is greater than the number of second electrode pads in the same partitioned area.

8. The solid-state imaging device according to claim 6, wherein the number of first electrode pads is less than the number of second electrode pads in the same partitioned area.

9. The solid-state imaging device according to claim 1, wherein the first substrate and the second substrate are stacked, and
wherein the first electrode pads and the second electrode pads are arranged such that a projected image of the electrode pad on one side of the set of electrode pads includes a projected image of the electrode pad on the other side when a set of electrode pads including the first electrode pad and the second electrode pad bonded to both ends of the connecting portion is projected onto a virtual horizontal plane parallel to the first substrate and the second substrate.

10. The solid-state imaging device according to claim 9, wherein the set of electrode pads is constituted by a combination of one of the first electrode pads and one of the second electrode pads.

11. The solid-state imaging device according to claim 9, wherein the set of electrode pads is constituted by a combination of two or more of the first electrode pads and one of the second electrode pads,
wherein the electrode pad on one side is the single second electrode pad, and
wherein the electrode pads on the other side are the two or more first electrode pads.

12. The solid-state imaging device according to claim 9, wherein the set of electrode pads is constituted by a combination of one of the first electrode pads and two or more of the second electrode pads,
wherein the electrode pad on one side is the single first electrode pad, and
wherein the electrode pads on the other side are the two or more second electrode pads.

13. The solid-state imaging device according to claim 1, wherein each pixel includes:

a photoelectric conversion element included in the first substrate;
a signal accumulation circuit that is included in the second substrate and accumulates a signal generated from the photoelectric conversion element and passing through the connecting portion; and
an output circuit that outputs the signal accumulated in the signal accumulation circuit.

14. The solid-state imaging device according to claim 1, wherein each pixel includes:
a signal accumulation circuit that is included in the second substrate and accumulates a signal generated from the corresponding photoelectric conversion element; and
an amplification circuit that amplifies the signal generated from the photoelectric conversion element, and
wherein the signal accumulation circuit accumulates the amplified signal amplified by the amplification circuit.

15. The solid-state imaging device according to claim 14, wherein each pixel further includes a noise reduction circuit that reduces noise in the amplified signal, and
wherein the signal accumulation circuit accumulates the amplified signal from which noise is reduced.

16. The solid-state imaging device according to claim 15, wherein the amplification circuit includes an amplification transistor that receives the signal generated from the photoelectric conversion element using the gate thereof, that amplifies the signal received using the gate, and that outputs the amplified signal from one of the source and the drain thereof.

17. The solid-state imaging device according to claim 16, wherein the noise reduction circuit includes:
a clamp capacitor that clamps the amplified signal output from the amplification transistor; and
a transistor that receives a signal corresponding to the amplified signal clamped by the clamp capacitor using one of the source and the drain thereof and that samples and holds the signal received using one of the source and the drain and accumulates the signal in the signal accumulation circuit.

18. The solid-state imaging device according to claim 17, wherein each connecting portion is disposed between the photoelectric conversion element and the amplification transistor, between the amplification transistor and the clamp capacitor, between the clamp capacitor and the transistor, or between the transistor and the signal accumulation circuit in a path electrically connected from the photoelectric conversion element to the signal accumulation circuit.

19. The solid-state imaging device according to claim 1, wherein each connecting portion is a bump.

20. The solid-state imaging device according to claim 1, wherein each connecting portion includes a first electrode formed on the surface of the first substrate and a second electrode formed on the surface of the second substrate and bonded to the first electrode.

21. The solid-state imaging device according to claim 1, wherein the second substrate is connected to the opposite surface of the surface of the first substrate which is irradiated with light incident on the photoelectric conversion element.

22. The solid-state imaging device according to claim 14, further comprising:
a first reset circuit that resets the photoelectric conversion element;
a second reset circuit that resets an input portion of the amplification circuit;

a transfer circuit that sequentially transfers the signals generated from the plurality of photoelectric conversion elements to the input portion of the amplification circuit;

a second amplification circuit that amplifies the amplified signal accumulated in the signal accumulation circuit and outputs a second amplified signal; and a third reset circuit that resets an input portion of the second amplification circuit.

23. An imaging device comprising:

first electrode pads that are formed on a first substrate on which a plurality of photoelectric conversion elements included in pixels are arranged;

second electrode pads that are formed on a second substrate having a reading unit that reads signals of the pixels; and connecting portions, one end of each of which is bonded to the first electrode pads and the other end of each of which is bonded to the second electrode pads to electrically connect the first electrode pads and the second electrode pads to each other, wherein the plurality of pixels are partitioned into a plurality of areas for each unit pixel cell or each cell including a plurality of pixels, first to n-th of the first electrode pads and first to m-th of the second electrode pads (where n and m are integers equal or greater than 1) are allocated to the partitioned areas, and the first to nth first electrode pads and the first to m-th second electrode pads allocated to the same partitioned area are electrically connected to each other via the plurality of connecting portions, and signals transmitted from the first to n-th first electrode pads to the first to m-th second electrode pads are the same.

24. A signal reading method of reading a signal from pixels in a solid-state imaging device having: first electrode pads that are formed on a first substrate on which a plurality of photoelectric conversion elements included in pixels are arranged; second electrode pads that are formed on a second substrate having a reading unit that reads signals of the pixels; and connecting portions, one end of each of which is bonded to the first electrode pads and the other end of each of which is bonded to the second electrode pads to electrically connect the first electrode pads and the second electrode pads to each other, wherein the plurality of pixels are partitioned into a plurality of areas for each unit pixel cell or each cell including a plurality of pixels, first to n-th of the first electrode pads and first to m-th of the second electrode pads (where n and m are integers equal or greater than 1) are allocated to the partitioned areas, and the first to n-th first electrode pads and the first to m-th second electrode pads allocated to the same partitioned area are electrically connected to each other via the plurality of connecting portions, the signal reading method comprising:

a reading step of causing the reading unit to read a signal generated from the photoelectric conversion elements arranged on the first substrate via the first electrode pads, the connecting portions, and the second electrode pads, wherein signals transmitted from the first to n-th first electrode pads to the first to m-th second electrode pads are the same.

* * * * *